US008834685B2

(12) United States Patent
Morimoto et al.

(10) Patent No.: US 8,834,685 B2
(45) Date of Patent: Sep. 16, 2014

(54) SPUTTERING APPARATUS AND SPUTTERING METHOD

(75) Inventors: Naoki Morimoto, Susono (JP); Junichi Hamaguchi, Susono (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 13/130,589

(22) PCT Filed: Dec. 8, 2009

(86) PCT No.: PCT/JP2009/006699
§ 371 (c)(1), (2), (4) Date: Jun. 28, 2011

(87) PCT Pub. No.: WO2010/070845
PCT Pub. Date: Jun. 24, 2010

(65) Prior Publication Data
US 2011/0247928 A1    Oct. 13, 2011

(51) Int. Cl.
*C23C 14/35* (2006.01)
*H01J 37/34* (2006.01)
*C23C 14/04* (2006.01)
*H01L 21/285* (2006.01)
*C23C 14/34* (2006.01)

(52) U.S. Cl.
CPC ......... *H01J 37/3405* (2013.01); *H01J 37/3458* (2013.01); *C23C 14/358* (2013.01); *H01J 37/3452* (2013.01); *H01J 37/3447* (2013.01); *C23C 14/351* (2013.01); *C23C 14/046* (2013.01); *H01L 21/2855* (2013.01); *C23C 14/3407* (2013.01)
USPC .................................. 204/192.12; 204/192.17

(58) Field of Classification Search
USPC ............. 204/298.06, 298.12, 298.18, 298.19, 204/298.16, 192.12, 192.17
See application file for complete search history.

(56) References Cited

U.S. PATENT DOCUMENTS 5,482,611 A    1/1996    Helmer et al.
5,976,334 A *  11/1999   Fu et al. ................. 204/298.19

(Continued)

FOREIGN PATENT DOCUMENTS

GB    1154249 A    9/1985
JP    60-184676 A  9/1985

(Continued)

OTHER PUBLICATIONS

Machine Translation JP 06-200375 dated Jul. 1994.*

(Continued)

*Primary Examiner* — Rodney McDonald
(74) *Attorney, Agent, or Firm* — Cermak Nakajima McGowan LLP; Tomoko Nakajima

(57) ABSTRACT

The sputtering apparatus has: a vacuum chamber in which a substrate is disposed; a cathode unit which is disposed inside the vacuum chamber so as to lie opposite to the substrate. The cathode unit has mounted a bottomed cylindrical target material from a bottom side thereof into at least one recessed portion formed in one surface of a holder, and has assembled therein a magnetic field generator for generating a magnetic field in an inside space of the target material. The sputtering apparatus further has: an anode shield to which a positive electric potential is applied; a gas introduction device for introducing a sputtering gas into the vacuum chamber; a power supply for activating power to the cathode unit; a vertical magnetic field generator including coils disposed along a wall surface of the vacuum chamber about a reference axis connecting the cathode unit and the substrate, and a power supply; and a controller for switching on or off the introduction of the sputtering gas from the gas introduction device.

2 Claims, 3 Drawing Sheets

(56) References Cited

U.S. PATENT DOCUMENTS

| | | | | |
|---|---|---|---|---|
| 5,997,699 | A | * | 12/1999 | Leiphart .................. 204/192.3 |
| 6,413,392 | B1 | * | 7/2002 | Sahoda et al. ........... 204/298.18 |
| 6,423,192 | B1 | * | 7/2002 | Wada et al. .............. 204/192.12 |
| 6,755,945 | B2 | * | 6/2004 | Yasar et al. ................ 204/192.3 |
| 2002/0029960 | A1 | | 3/2002 | Morimoto et al. |
| 2004/0094402 | A1 | * | 5/2004 | Gopalraja et al. ....... 204/192.12 |
| 2005/0072669 | A1 | * | 4/2005 | Teranishi et al. ........ 204/298.18 |

FOREIGN PATENT DOCUMENTS

| | | | |
|---|---|---|---|
| JP | 61-088511 | A | 5/1986 |
| JP | 61-261473 | * | 11/1986 |
| JP | 62-077460 | A | 4/1987 |
| JP | 02-175864 | A | 7/1990 |
| JP | 06-200375 | * | 7/1994 |
| JP | 07-118845 | A | 5/1995 |
| JP | 07-183219 | A | 7/1995 |
| JP | 2002-080962 | A | 3/2002 |
| JP | 2006-169610 | A | 6/2006 |
| JP | 2008-047661 | A | 2/2008 |
| WO | WO2009/157438 | A1 | 12/2009 |

OTHER PUBLICATIONS

Chappe et al. "Titanium oxynitride thin films sputter deposited by the reactive gas pulsing process", Applied Surface Science, 253 (Jan. 2007) 5312-5316.*

International Search Report for PCT Patent App. No. PCT/JP2009/006699 (Mar. 2, 2010).

* cited by examiner

SPUTTERING APPARATUS AND SPUTTERING METHOD

This application is a national phase entry under 35 U.S.C. §371 of PCT Patent Application No. PCT/JP2009/006699, filed on Dec. 8, 2009, which claims priority under 35 U.S.C. §119 to Japanese Patent Application No. 2008-318990, filed Dec. 15, 2008, both of which are incorporated by reference.

TECHNICAL FIELD

The present invention relates to a sputtering apparatus and a sputtering method for forming a film on a substrate to be processed (hereinafter also referred to as "to-be-processed substrate").

BACKGROUND ART

In a film-forming step for manufacturing semiconductor devices, there is used, for example, a sputtering apparatus. The sputtering apparatus for this purpose is strongly required to be capable of forming a film with good coatability over the entire to-be-processed substrate accompanied by the recent trend for micro-fine wiring patterns with respect to micro-holes (micro-pores) of high aspect ratio, i.e., an improvement in coverage is strongly required.

In the conventional sputtering apparatus, there is disposed a magnet assembly provided with a plurality of magnets behind a target (i.e., on the side lying opposite to the surface to be sputtered) while alternately changing the polarities. By means of this magnet assembly, a tunnel-like magnetic field is generated in front of the target (i.e., on that side of the target which is sputtered). The electrons that are ionized in front of the target and the secondary electrons generated by the sputtering are collected by the magnetic field to thereby increase the electron density in front of the target, whereby the plasma density is increased.

In the above-mentioned kind of sputtering apparatus, those regions of the entire target which are subjected to the influence of the above-mentioned magnetic field are preferentially sputtered. Therefore, in case the above-mentioned regions are located, e.g., near the center of the target from the viewpoint of stability in electric discharging or of the improvement of the use efficiency of the target, the amount of erosion of the target at the time of sputtering increases near the center of the target. Therefore, in the peripheral portion of the substrate, the target material particles (e.g., metallic particles, hereinafter referred to as "sputtered particles") are incident and get adhered at an inclined angle. As a result, in case the sputtering apparatus is used for film forming of the above-mentioned purposes, it is known that there will arise a problem of asymmetry of coverage especially in the peripheral portion of the substrate.

In order to solve the above problems, there is known, in Patent Document 1, a sputtering apparatus in which: a first target is disposed above a stage on which the substrate is mounted inside the vacuum chamber, the first target being substantially in parallel with the surface of the stage; and a second target is disposed slantingly above the stage at an inclination relative to the surface of the stage, i.e., a sputtering apparatus in which a plurality of cathode units are disposed.

However, if a plurality of cathode units are disposed in the vacuum chamber as in the above-mentioned Patent Document 1, there is a disadvantage in that the apparatus arrangement becomes complicated, and that a higher cost will be incurred due to an increase in the number of parts because power supplies for activating power as well as magnet assemblies are required corresponding to the number of targets.

On the other hand, the inventors of this patent application developed a cathode unit which has a bottomed cylindrical target material (i.e., a target material of a cylindrical shape having a bottom such as a cup) to be mounted from a bottom side thereof into a recessed portion formed in one surface of a holder so that a magnetic field can be generated in an inside space of the target material. Then, they came to a finding that, by applying this cathode unit to a sputtering apparatus in which a vertical magnetic field works over the entire surface of the substrate, film forming can be performed while keeping an extremely high uniformity in film thickness in a portion lying opposite to an opening in the target material and therearound (Japanese Patent Application No. 2008-167175).

When a barrier film of Cu or Ta is formed relative to micro-holes by using the above-mentioned arrangement, if film forming by sputtering is performed by self-discharging in the inside space of the target material, the following disadvantage has been found to take place, i.e., that the upper openings of the micro-holes will be clogged by getting covered with a thin film made up of the sputtered particles.

PRIOR ART DOCUMENT

Patent Document

Patent Document 1: JP-A-2008-47661

SUMMARY OF THE INVENTION

Problems to be Solved by the Invention

In view of the above points, this invention has a problem of providing a sputtering apparatus and a sputtering method in which a film can be formed with good coating characteristics relative to each of those micro-holes of high aspect ratio which are formed on the surface of the substrate such as a wafer or the like.

Means for Solving the Problems

In order to solve the above-mentioned problems, this invention is a sputtering apparatus comprising: a vacuum chamber in which a to-be-processed substrate is disposed; and a cathode unit which is disposed inside the vacuum chamber so as to lie opposite to the substrate. The cathode unit has mounted a bottomed cylindrical target material from a bottom side thereof into at least one recessed portion formed in one surface of a holder. The cathode unit has assembled therein a magnetic field generating means that generates a magnetic field in an inside space of the target material. The sputtering apparatus further comprises: an anode shield which is disposed so as to cover the holder at least over a surface lying opposite to the substrate, the anode shield having applied thereto a positive electric potential; a gas introduction means that introduces a predetermined sputtering gas into the vacuum chamber; a sputtering power supply that activates power to the cathode unit; a vertical magnetic field generating means including coils disposed along a wall surface of the vacuum chamber about a reference axis connecting the cathode unit and the substrate, and a power supply to enable energization of each of the coils; and a control means that switches on or off the introduction of the sputtering gas from the gas introduction means.

According to this invention, after having evacuated the vacuum chamber, the sputtering gas consisting of a rare gas is introduced thereinto. A positive electric potential is applied to the anode shield and a negative electric potential is applied to the cathode unit. Then, glow discharge will be generated in a space between the front of the cathode unit and the inside of the target material, whereby a plasma is contained in a space inside the target material by the magnetic field generated by the magnetic field generating means (particularly, the secondary electrons generated by the sputtering come to become easily contained). If the introduction of the sputtering gas is stopped in this state, self-discharge comes to take place in the space inside the target material at a low pressure. In order for the self-discharge to surely continue in the space inside the target material, it is preferable to generate the magnetic field of magnetic field strength above 500 Gauss.

During self-discharging, the sputtering gas ions or the like in the plasma come into collision with the inner wall surfaces of the target material so as to sputter the inner wall surfaces. The sputtered particles and sputtered particle ions are discharged into the space in front of the cathode unit with a strong linearity out of the opening in the target material. Then, the sputtered particles having positive electric charges, in particular, will be changed in their direction due to the vertical magnetic field and will get incident into the substrate substantially at right angles. As a result, they will also come to get adhered to, and deposited on, the micro-holes with good coverage.

During this kind of self-discharging, there will be a state in which the sputtered particles having positive electric charges become dominant. Consequently, out of the surfaces of the substrate, that portion which lies opposite to the opening of the target material will have locally high sputtering rate. If the film forming by sputtering is continued as it is, there is a possibility that the openings on the upper surface of the micro-holes will be covered by the film made up of sputtered particles, thereby being clogged (blocked).

As a solution, during sputtering operation, the sputtering gas is introduced through the gas introduction means in a predetermined flow at a predetermined interval. In a state in which the sputtering gas is introduced, the ions of the sputtering gas that was ionized in the plasma are also supplied to the portion, among the surfaces of the substrate, that lies opposite to the opening of the target material. Due to the ions of the sputtering gas, what are adhered to, and deposited on, the surface of the substrate will be etched. In this case, if the vertical magnetic field strength or the gas flow of the inert gas is changed, the etching speed can be controlled. The gas flow at this time may be adjusted to, e.g., a range of 3 to 100 sccm.

In this manner, by controlling the introduction of the sputtering gas on or off during film formation, the deposition and etching of the sputtered particles come to be performed alternately. As a result, by employing the sputtering apparatus according to this invention in the film-forming step for manufacturing semiconductor devices, without the possibility of clogging in the openings on the upper surfaces of the micro-holes, film formation can be performed with good coating characteristics (i.e., with good coverage) even with respect to the micro-holes of high aspect ratio.

In this invention, preferably, the anode shield may further comprises: an opening portion facing the target material; and a cylindrical portion which is formed around a periphery of the opening portion so as to be elongated toward the substrate.

Further, in order to solve the above-mentioned problems, the sputtering method according to this invention is a sputtering method for forming a film on a surface of the to-be-processed substrate with the sputtering apparatus according to claim 1 or 2. The method comprises: generating, with the vertical magnetic field generating means, a vertical magnetic field at a predetermined interval such that vertical lines of magnetic force flow between the target material and a surface of the substrate at a predetermined spacing from one another; introducing the sputtering gas by the gas introducing means into the vacuum chamber; sputtering an inner wall surface of the target by applying a positive electric potential to the anode shield and also by applying a negative electric potential to the cathode unit; and controlling with the control means, during sputtering, to switch on or off the introduction of the sputtering gas at a predetermined interval.

In this case, preferably a bias electric potential is applied to the substrate. In this example, by varying the bias electric potential, the film-forming speed and the etching speed at the time of gas introduction can be adjusted.

EMBODIMENTS FOR CARRYING OUT THE INVENTION

Figure 1:
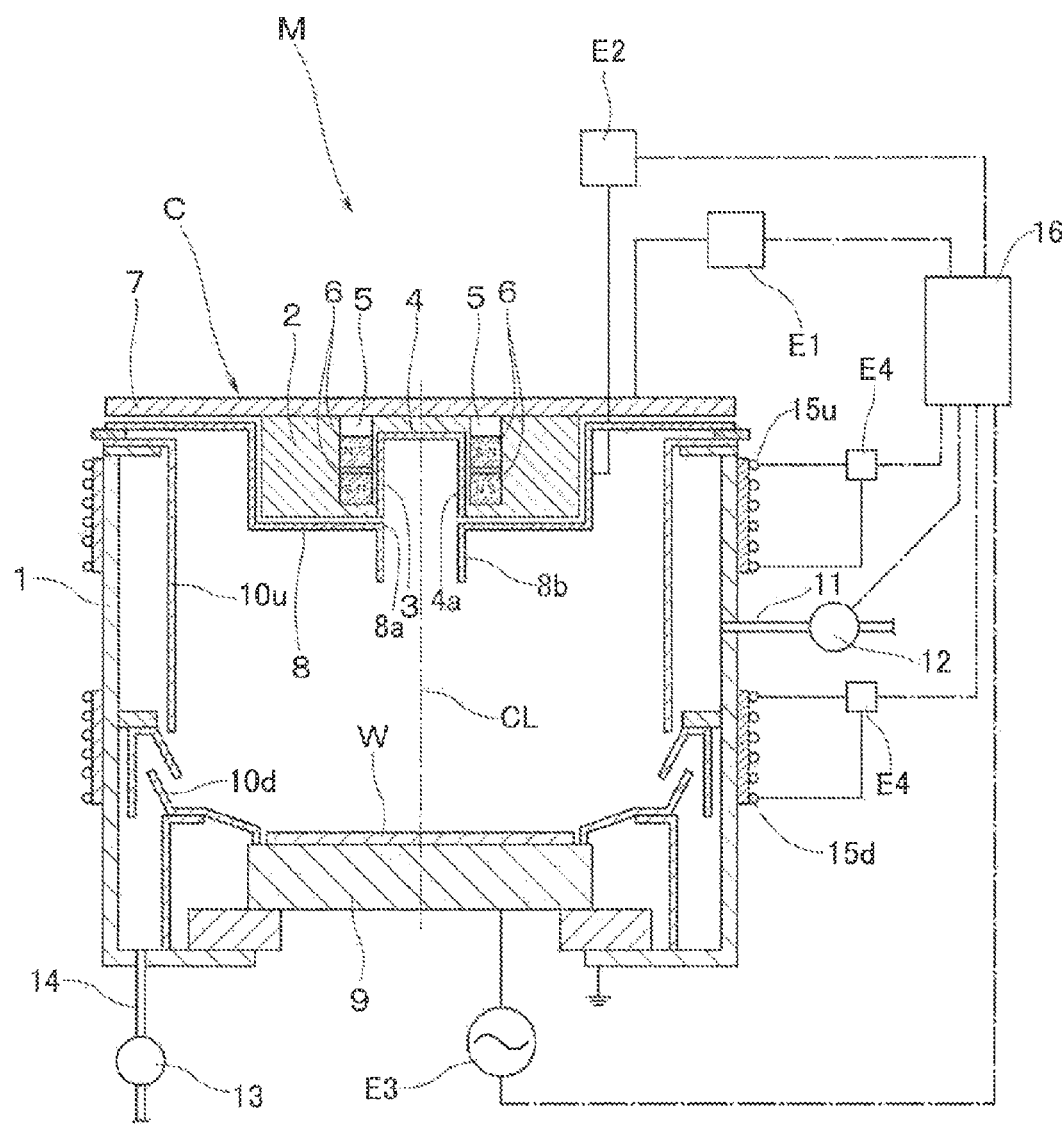
FIG. 1 is a sectional view schematically showing the constitution of a sputtering apparatus according to an embodiment of this invention.

With reference to the figures, a description will now be made of a sputtering apparatus provided with a cathode unit according to one embodiment of this invention. As shown in FIG. 1, the sputtering apparatus M is provided with a vacuum chamber 1 that is capable of forming a vacuum atmosphere therein, and has mounted a cathode unit C on a ceiling portion of the vacuum chamber 1. In the following, a description will be made on condition that the ceiling side is an "upper" side and the bottom side thereof is a "lower" side, as far as the vacuum chamber 1 is concerned.

Figure 2:
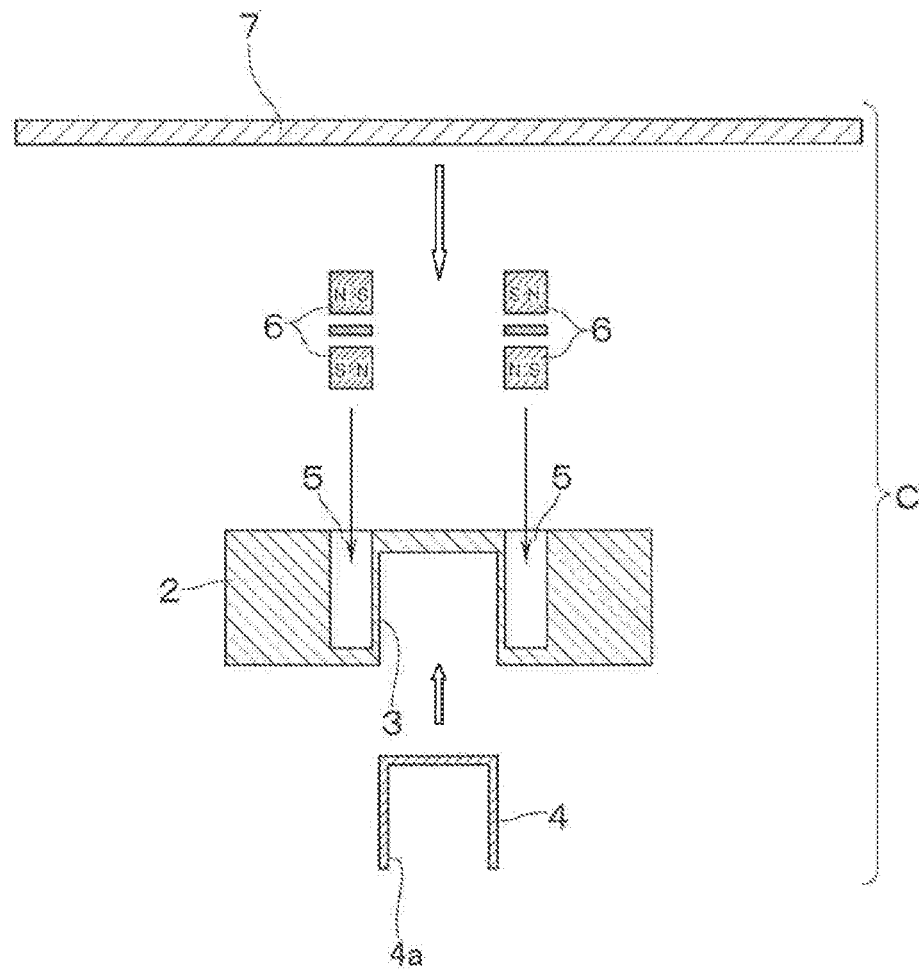
FIG. 2 is an exploded view explaining a cathode unit which is used in the sputtering apparatus of FIG. 1.

As shown in FIG. 2, the cathode unit C is provided with a holder 2 of columnar shape which is made of a material having electric conductivity, e.g., a material that is the same as the target material which is to be described in detail hereinafter. The holder 2 has formed a single recessed portion 3 in the center of the bottom surface of the holder 2. The opening area of the recessed portion 3 is set to be 30 to 50 mm in diameter and the recessed portion 3 has a target material 4 that is inserted thererinto.

The target material 4 is made of a material which is appropriately selected depending on the composition of a thin film which is going to be formed on the to-be-processed substrate W. For example, it is made of Cu, Ti or Ta and has an external shape of a bottomed cylinder so that there is inside thereof a space 4a for electric discharging. The target material 4 is detachably inserted by fitting, from the bottom side thereof, into the recessed portion 3. The length of the target material 4 is set such that the lower surface of the target material 4 is flush with the bottom surface of the holder 2.

On the upper surface of the holder 2 there are provided a plurality of housing holes 5 which are elongated in the direction of the thickness of the holder 2. Magnets 6 which are formed into a columnar shape or a prismatic shape are inserted into the housing holes 5. These elements altogether constitute a magnetic field generating means. In this embodiment, there are formed housing holes 5 in eight positions in the circumference of the holder 2 at a spacing of 45 degrees each. In each of the housing holes 5 two magnets 6 of prismatic shape are disposed while keeping a predetermined spacing in the thickness direction of the holder 2 by alternately changing the polarity thereof on the side of the target material 4. Strong magnetic field of above 500 Gauss is thus generated in the space 4a.

On the upper surface of the holder 2 there is mounted a supporting body 7 of circular plate shape after having housed magnets 6 in the housing holes 5, and the cathode unit C is mounted through an insulating body (not illustrated). The holder 2 is connected to a DC power supply E1 which is a sputtering power supply. During sputtering, a negative DC potential is applied to the holder 2, and in turn, to the target material 4. The sputtering power supply is not limited to the above example; another known power supply may also be used.

On the lower side of the holder 2, there is disposed an anode shield 8 which has an electrical conductivity. The anode shield 8 has a shape to cover the entire lower surface of the holder 2, and is provided with an opening portion 8a to which the target material 4 faces. On the periphery of the opening portion 8a, there is formed a hollow cylindrical portion 8b which is elongated toward the substrate W.

Further, the anode shield 8 is connected to another DC power supply E2 and, during sputtering, a positive DC potential is applied to the anode shield. According to this arrangement, the cylindrical portion 8b serves the purpose of assisting the discharging of the ions of the sputtered particles with a strong linearity from the space 4a of the target material 4 toward the substrate W.

At the bottom portion of the vacuum chamber 1, there is disposed a stage 9 in a manner to lie opposite to the cathode unit C. It is thus possible to hold in position the to-be-processed substrate W such as a silicon wafer or the like. The stage 9 has connected thereto a high-frequency power supply E3. During sputtering, the stage 9 and, in turn, the substrate W have applied thereto a bias electric potential, so that the ions of the sputtered particles from the target material 4 and the ions of the sputtering gas positively get attracted toward the substrate W.

The inner wall of the vacuum chamber 1 is provided with a pair of upper and lower deposition-prevention plates $10u$, $10d$ so that, while defining the sputtering chamber inside the vacuum chamber 1, they prevent the sputtered particles from getting adhered to the inner wall or the like of the vacuum chamber 1. The side wall of the vacuum chamber 1 has connected thereto a gas pipe 11 which introduces the sputtering gas which is a rare gas such as argon or the like. The other end of the gas pipe 11 is in communication with a gas source (not illustrated) through a mass flow controller 12. In this case, these parts constitute the gas introduction means which enables to introduce into the vacuum chamber 1 the sputtering gas whose flow is controlled. In addition, the vacuum chamber 1 has connected to the bottom portion thereof an exhaust pipe 14 which is in communication with an evacuating means 13 made up of a turbo molecular pump, rotary pump, or the like.

On an outer wall surface of the vacuum chamber 1 there are disposed an upper coil $15u$ and a lower coil $15d$ at a predetermined vertical spacing from each other about a reference axis CL connecting the centers of the cathode unit C and of the substrate W, and free ends of the coils are respectively connected to DC power supplies E4. Each of the upper and the lower coils $15u$, $15d$ and the DC power supply E4 constitute a vertical magnetic field generating means for generating a vertical magnetic field so that the vertical lines of magnetic force pass at equal spacing from one another from the cathode unit C to the entire surface of the substrate W. Then, during sputtering, the sputtered particles of the target material 4 and the ions of the sputtered particles are caused to change their directions in the vertical magnetic field so as to be incident into the substrate W substantially at right angles thereto and get adhered to the substrate.

The DC power supply E4 shall preferably be arranged to allow for arbitrary changes in the current value and the current direction to each of the upper and the lower coils $15u$, $15d$. The energizing current (e.g., 15 A or less) is set such that the magnetic field strength becomes 100 Gauss or more when the vertical magnetic field is generated. If the magnetic field strength is below 100 Gauss, plasma will be deactivated, so that film formation cannot be performed well. Further, in order to efficiently form a film of uniform thickness over the entire surface of the substrate without deactivation of plasma under the influence of the vertical magnetic field, the direction of the current to flow through each of the upper and the lower coils $15u$, $15d$ is controlled so that an upward vertical magnetic field is generated. It is to be noted that the number of coils is not limited to the above-mentioned example.

The sputtering apparatus M has a known control means 16 which is provided with a microcomputer, sequencer, or the like. The control means 16 makes an overall control of the operation of the above-mentioned DC power supplies and high-frequency power supply E1 through E4, the operation of the mass flow controller 12, the operation of the evacuating means 13, or the like.

A description will now be made of the film forming using the above-mentioned sputtering apparatus 1 with reference to an example in which, after having formed a silicon oxide film (insulating film) on the surface of a Si wafer as a to-be-operated substrate W, the silicon oxide film having patterned therein micro-holes for the purpose of wiring by a known method is used to thereby form by sputtering a Cu film as a seed film.

First, the target material 4 is fitted by insertion into the recessed portion 3 in the holder 2 and, also, the magnets 6 are disposed into the housing holes 5 from above the holder 2. The supporting member 7 is then mounted and the cathode unit C is thus assembled. Thereafter, the cathode unit C is mounted on the ceiling portion of the vacuum chamber 1 through an insulating body.

Then, after having mounted the substrate W on the stage 9 which lies opposite to the cathode unit C, the evacuating means 13 is operated to evacuate the vacuum chamber 1 to a predetermined vacuum (e.g., $10^{-5}$ Pa). Once the pressure in the vacuum chamber 1 has reached the predetermined value, the mass-flow controller 12 is controlled to introduce the sputtering gas into the vacuum chamber 1 in a predetermined flow.

Then, by energizing each of the upper and the lower coils $15u$, $15d$ by means of the DC power supply E4, the vertical magnetic field is generated so that the vertical lines of magnetic force pass at equal spacing from one another from the cathode unit C to the entire surface of the substrate W. A positive electric potential (e.g., 5 to 150 V) is applied from the DC power supply E2 to the anode shield 8 and a negative electric potential (e.g., 200 to 600 V) is applied from the DC power supply E1 to the holder 2. At the same time, a negative bias electric potential (e.g., 100 to 600 V) is applied by the high-frequency power supply E3 to the substrate W.

According to this arrangement, glow discharge is generated in the space in front of the cathode unit C through the space 4a inside the target material 4, thereby containing the plasma in the above-mentioned space 4a by means of the magnetic field generated by the magnets 6. Thereafter, when the mass-flow controller 12 is controlled to stop the introduction of the sputtering gas, self-discharge takes place in the above-mentioned space 4a at a low pressure.

In this state, the argon ions or the like in the plasma get collided with the inner wall surfaces of the target material 4 so as to sputter the target material. As a result, the Cu atoms get splashed and the Cu atoms and the ionized Cu ions are discharged toward the substrate W with strong linearity from the opening at the bottom surface of each of the target materials 4. As a result of combined effects of applying the bias electric potential and of having generated the vertical magnetic field, the sputtered particles and the ions of the sputtered particles the direction of which have been changed by the vertical magnetic field are positively drawn substantially vertically toward the substrate W to thereby get adhered to, and deposited on, the substrate W.

By the way, during this kind of self-discharging, there will be attained a state in which the sputtered particles having the positive electric potential become dominant. As a result, the sputtering rate will locally increase, among the surface of the substrate W, in the portion which lies opposite to the opening of the target material 4. If the film forming operation is continued as it is, there is a possibility that the openings on the upper surface of the micro-holes will be covered by a thin film made from the sputtered particles and get clogged.

As a solution, there has been employed an arrangement in which, during sputtering, the mass-flow controller 12 is controlled by the control means 16 so as to be switched on or off at a predetermined interval in order to introduce the sputtering gas into the vacuum chamber 1 at a predetermined flow. In this case, the interval of introducing the sputtering gas is set taking into consideration the gas exhaust speed or the like. Further, the time of introducing the sputtering gas is set within a range of 0.5 to 2.5 sec taking into consideration the gas exhaust speed or the like.

In a state in which the sputtering gas has been introduced again, the ions of the sputtering gas ionized in the plasma will be drawn toward the substrate W, and what have been adhered to, and deposited on, the substrate W come to be etched by the ions. In this case, the etching speed can be controlled by changing, e.g., the vertical magnetic field strength or the gas flow of the inert gas. At this time, the gas flow may be adjusted to the range, e.g., of 3 to 100 sccm. If the flow is below 3 sccm, there is a disadvantage in that the control of the gas flow becomes unstable. If the flow is above 100 sccm, on the other hand, there will be a disadvantage in that the gas exhaust time will become long.

In this manner, by controlling to switch on or off the introduction of the sputtering gas during sputtering, the deposition and etching of the sputtered particles and the ions of the sputtered particles come to be alternately performed. As a result, without the possibility of clogging of the openings in the upper surfaces of the micro-holes, film-forming operation can be performed with good coating characteristics (i.e., with good coverage) relative to the micro-holes of high aspect ratio.

In order to confirm the above-mentioned effects, a Cu film was formed by using the sputtering apparatus as shown in FIG. 1. As the substrate W, there was used one which was manufactured by forming a silicon oxide film over the entire front surface of a Si wafer of 300 mm in diameter, and then micro-holes (40 nm in width, 140 nm in depth) were formed by patterning in this silicon oxide film in a known method. On the other hand, as the target material 4, there was used one which was made of Cu of 99% in composition ratio and having a plate thickness of 5 mm and in which the opening on the lower surface was formed into 30 mm in diameter.

A Cu film was formed under the film-forming conditions in that the distance between the lower surface of the holder 2 and the substrate W was set to 300 mm, the activation power to the target material 4 was set to 6.6 kW (current 19.5 A), the activation voltage to the anode shield 8 was set to 150 V, energizing current to each of the upper and the lower coils 15u, 15d was set to 30 A, the bias power was set to 0 kW, and the sputtering time was set to 15 seconds. As the sputtering gas, there was used Ar gas, and for one second after starting the film formation by sputtering, the sputtering gas was introduced at a flow of 100 sccm and was thereafter introduced into the vacuum chamber 1 at each of the flow of 0 to 100 sccm.

Figure 3:
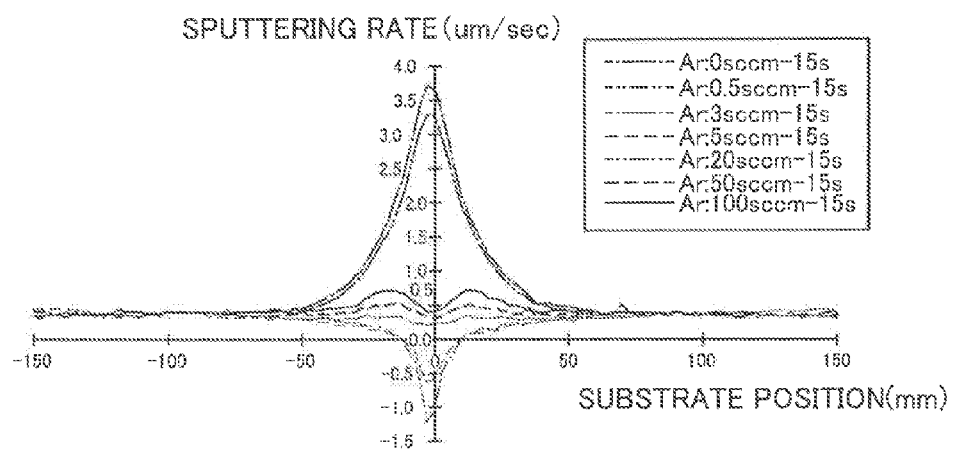
FIG. 3 is a graph showing the relationship between the sputtering gas introduction and the sputtering rate.
Figure 4:
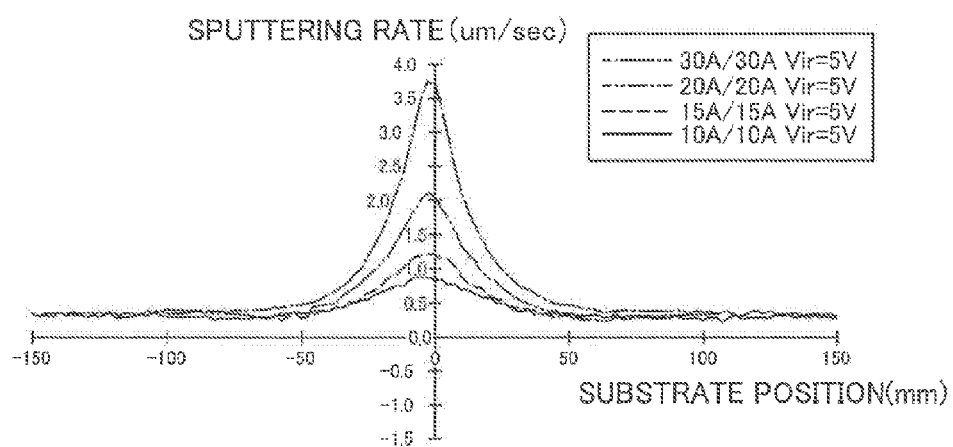
FIG. 4 is a graph showing the relationship between the energizing current to the coils and the sputtering rate.

FIG. 3 is a graph showing the measured values of sputtering rate when the film was formed under the above-mentioned conditions. According to this, confirmation was made that, when the flow of the sputtering gas was less than 3 sccm, a high sputtering rate exceeding 3 nm/sec was obtained and that the uniformity in the film thickness distribution became extremely high right below and around the opening in the cathode material 4.

On the other hand, it was confirmed that, when the flow of the sputtering gas exceeded 3 sccm, the sputtering rate at the position right below the opening of the target material 4 extremely lowered and that the Cu film adhered to, and deposited on, the surface of the substrate W came to be etched. In this case, it was additionally confirmed that, with an increase in the bias power, the amount of etching increased.

It can be seen from the above that, by controlling to switch on or off the introduction of the sputtering gas during film formation, thereby performing the deposition and etching of the sputtered particles at a predetermined interval, film-forming operation can be performed with good coating characteristics even relative to the micro-holes of high aspect ratio without the possibility of clogging in the openings on the upper surfaces of the micro-holes. In this case, by confirming the coverage of the micro-holes with SEM photographs, it was confirmed that dense thin films have been formed on the wall surfaces of the micro-holes.

Then, tests were performed to confirm the effects of the vertical magnetic field. In these tests, initially for one second after starting the film formation, the sputtering gas was introduced at a flow of 100 sccm and thereafter the conditions were the same as those mentioned above except at the time when the point that the introduction of the gas was stopped. Instead, the energizing current to each of the upper and the lower coils 15u, 15d was varied.

According to this arrangement, it was confirmed that, with an increase in the energizing current to each of the upper and the lower coils 15u, 15d, the sputtering rate became higher right below and around the opening in the target material 4.

A description has so far been made of the sputtering apparatus and sputtering method according to this embodiment. This invention shall, however, be not limited to the above. For example, a multiplicity of recessed portions may be densely formed over the entire lower surface of the holder 2, and a target material is inserted by fitting into each of the recessed portions to thereby constitute the cathode unit.

DESCRIPTION OF REFERENCE NUMERALS AND CHARACTERS

M sputtering apparatus
1 vacuum chamber
2 holder (cathode unit)
3 recessed portion
4 target material (cathode unit)
6 magnet (magnetic field generating means)

11 gas pipe (gas introduction means)
12 mass flow controller (gas introduction means)
15u upper coil (vertical magnetic field generating means)
15d lower coil (vertical magnetic field generating means)
C cathode unit
E1 to E4 power supply
W substrate

What is claimed is:

1. A sputtering method for forming a film on a surface of a to-be-processed substrate comprising:

providing a sputtering apparatus comprising:

a vacuum chamber in which the to-be-processed substrate is disposed;

a cathode unit which is disposed inside the vacuum chamber so as to lie opposite to the substrate, the cathode unit having mounted a bottomed cylindrical target material from a bottom side thereof into at least one recessed portion formed in one surface of a holder, the cathode unit having assembled therein a magnetic field generating means that generates a magnetic field in an inside space of the target material;

an anode shield which is disposed so as to cover the holder at least over a surface lying opposite to the substrate, the anode shield having applied thereto a positive electric potential;

a gas introduction means that introduces a predetermined sputtering gas which is a rare gas into the vacuum chamber;

a sputtering power supply that activates power to the cathode unit;

a vertical magnetic field generating means including: coils disposed along a wall surface of the vacuum chamber about a reference axis connecting the cathode unit and the substrate; and a power supply to enable energization of each of the coils; and a control means that controls the introduction of the sputtering gas on or off during film formation, the control means being so constructed and arranged that deposition and etching relative to the substrate are performed alternately;

generating, with the vertical magnetic field generating means, a vertical magnetic field at a predetermined interval such that vertical lines of magnetic force flow between the target material and a surface of the substrate at a predetermined spacing from one another;

introducing the sputtering gas by the gas introducing means into the vacuum chamber;

sputtering an inner wall surface of the target by applying a positive electric potential to the anode shield and also by applying a negative electric potential to the cathode unit; and controlling the introduction of the sputtering gas on and off a plurality of times during the step of the sputtering such that deposition and etching relative to the substrate are performed alternately.

2. The sputtering method according to claim 1, wherein a bias electric potential is applied to the substrate such that deposition and etching relative to the substrate are performed alternately.

* * * * *